United States Patent
Zhong et al.

(10) Patent No.: US 11,849,560 B1
(45) Date of Patent: Dec. 19, 2023

(54) HOLDING MODULE AND ELECTRONIC DEVICE

(71) Applicant: Wistron Corporation, New Taipei (TW)

(72) Inventors: Yong-Qing Zhong, New Taipei (TW); Zhao-Ping Fu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 17/965,834

(22) Filed: Oct. 14, 2022

(30) Foreign Application Priority Data

May 30, 2022 (CN) .......................... 202210597900.3

(51) Int. Cl.
*H05K 7/14* (2006.01)

(52) U.S. Cl.
CPC .................. *H05K 7/1489* (2013.01)

(58) Field of Classification Search
CPC .. H05K 7/1489; H05K 7/1402; H05K 7/1401; H05K 7/1404; H05K 7/1405; H05K 7/1407; H05K 7/1408; H05K 7/1409; H05K 7/1411; H05K 7/1421; H05K 7/1424; H05K 7/1461; H05K 5/023; H05K 5/0221; G06F 1/185; G06F 1/186; G06F 1/187; G06F 1/184
See application file for complete search history.

(56) References Cited

U.S. PATENT DOCUMENTS 10,251,300 B1 * 4/2019 Mao .................... H05K 7/1487
10,863,644 B1 * 12/2020 Tseng .................. H05K 7/1487
10,863,647 B1 * 12/2020 Escamilla .............. H05K 5/023
2008/0264192 A1 * 10/2008 Christensen ......... H05K 7/1409
　　　　　　　　　　　　　　　　　　　　　　　　74/469
2015/0103492 A1 * 4/2015 Wu ...................... H05K 7/1431
　　　　　　　　　　　　　　　　　　　　　　　　361/726

FOREIGN PATENT DOCUMENTS

CN　　112445298 A　　3/2021
TW　　M252247 U　　12/2004

OTHER PUBLICATIONS

Examination report dated May 18, 2023, listed in related Taiwan patent application No. 111122514.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A holding module is installed in a chassis of an electronic device. The holding module is used to hold an expansion module and includes a holding member, a fixation member, and a linkage member. The holding member includes a carrier plate, a first side plate, and a second side plate. The first side plate and the second side plate are connected to two opposite sides of the carrier plate, respectively. The fixation member is pivotally connected to the first side plate and the second side plate. The fixation member is provided with a linkage portion. The linkage member is rotatably arranged in the holding member. The linkage member includes a docking portion and a pushing portion. The docking portion is connected to the linkage portion. The pushing portion is connected to the expansion module selectively.

20 Claims, 17 Drawing Sheets

HOLDING MODULE AND ELECTRONIC DEVICE

CROSS-REFERENCE TO RELATED APPLICATION

This non-provisional application claims priority under 35 U.S.C. § 119(a) to Patent Application No. 202210597900.3 filed in China on May 30, 2022, the entire contents of which are hereby incorporated by reference.

BACKGROUND

Technical Field

The instant disclosure is related to a holding module and an electronic device, especially a holding module for fixing circuit board(s).

Related Art

The cabinet of a rack server known to the inventor is usually provided with a plurality of sub-chassis. A sub-chassis can contain a plurality of holding members. A holding member can hold a circuit board or a plurality of circuit boards to form an operation node or a storage node. The operation node and the storage node can perform cloud big-data computation. One side of the holding member is provided with a fixation rack. The fixation rack increases the robustness of the corresponding side of the holding member and keeps the holding member from being deformed. When installing a circuit board into the holding member, the fixation rack has to be removed, and the circuit board has to be placed into the holding member inclinedly. Next, the connector(s) on one side of the circuit board is(are) inserted into the connection hole(s) on the side portion of the holding member, and then the circuit board can be placed in the holding member horizontally. Then, nine screws are used to lock the circuit board in the holding member, and three other screws are then used to fix the fixation rack on one side of the holding member. Consequently, this installation process is complicated and high-cost. Furthermore, during the alignment between the connectors of the circuit board and the connection holes of the holding member, owing to the certain orientation for installing the circuit board with the holding member, the user (or the operator) may fail to successfully perform the alignment between the connector and the connection holes, or the user (or the operator) may need to perform the alignment between the connector and the connection holes forcefully. As a result, damage to the connectors may be occurred.

SUMMARY

In view of the above, some exemplary embodiments of the instant disclosure provide a holding module used to hold an expansion module. The holding module comprises a holding member, a fixation member, and a linkage member. The holding member comprises a carrier plate, a first side plate, and a second side plate. The first side plate and the second side plate are connected to two opposite sides of the carrier plate, respectively. The fixation member is pivotally connected to the first side plate and the second side plate. The fixation member is provided with a linkage portion. The linkage member is rotatably arranged in the holding member. The linkage member comprises a docking portion and a pushing portion. The docking portion is connected to the linkage portion, and the pushing portion is connected to the expansion module selectively.

In some exemplary embodiments, the fixation member further comprises a positioning member. The holding member is provided with a matching member, and the positioning member matches with one of the matching member selectively.

In some exemplary embodiments, the fixation member comprises a handle and two side arms respectively connected to two ends of the handle. The two side arms are provided with a plurality of the pivot portions. Each of the two side arms is provided with a pivot portion, and each of the pivot portion is pivotally connected to the first side plate or the second side plate respectively.

In some exemplary embodiments, in each of the side arms, a line connecting between the positioning member and the pivot portion is an axial line, and the linkage portion is between the positioning member and the pivot portion and is aligned with the axial line.

In some exemplary embodiments, the linkage member comprises a first connection member and a second connection member. The first connection member is provided with a first shaft portion, a first docking portion, and a resisting portion. The first shaft portion is pivotally connected to the pivot plate of the carrier plate. The first docking portion and the resisting portion are on two opposite ends of the first shaft portion, respectively. The first docking portion is moveably connected to the linkage portion. The second connection member is provided with a second shaft portion, a second docking portion, and a pushing portion. The second shaft portion is pivotally connected to the carrier plate. The second docking portion and the pushing portion are on opposite sides of the second shaft portion, respectively. The second docking portion is moveably connected to the resisting portion. The pushing portion is connected to the expansion module selectively.

In some exemplary embodiments, the second connection member comprises a bent portion and a main body, the second docking portion is on the bent portion, and the bent portion and the pushing portion are on two opposite sides of the main body, respectively.

In some exemplary embodiments, the positioning member comprises a fixed end and a free end, the fixed end is fixed on the fixation member, the free end is moveably arranged through a through hole of the fixation member, and the free end is adapted to be selectively matched with the member.

In some exemplary embodiments, each of the first side plate and the second side plate is provided with the matching member, each of the two side arms of the fixation member is provided with the positioning member and the linkage portion. One of the positioning members is matched with the matching member of the first side plate, and the other one of the positioning members is matched with the matching member of the second side plate.

In some exemplary embodiments, the holding member further comprises a plurality of the linkage members, each of the linkage members is pivotally connected to the carrier plate and comprises the docking portion and the pushing portion, and the docking portion of each of the linkage members is connected to the linkage portion of a corresponding one of the two side arms.

In some exemplary embodiments, the carrier plate is provided with a pivot plate. The pivot plate extends from the carrier plate and is adjacent to one of the first side plate and the second side plate, and the linkage member is pivotally connected to the pivot plate.

In some exemplary embodiments, the linkage member is a connection base. The connection base has a bottom plate and a side plate, an angular relationship exists between the bottom plate and the side plate, the docking portion of the connection base is on the side plate, and the pushing portion is on the bottom plate.

In some exemplary embodiments, a line connecting between the positioning member and the pivot portion of the fixation member is an axial line, and the linkage portion is on the side plate and is misaligned with the axial line.

In some exemplary embodiments, an electronic device is provided. The electronic device comprises a chassis, a holding module, and an expansion module. The holding module is installed in the chassis. The holding module comprises a holding member, a fixation member, and a linkage member. The holding member comprises a carrier plate, a first side plate, and a second side plate. The first side plate and the second side plate are connected to two opposite sides of the carrier plate, respectively. The fixation member is pivotally connected to the first side plate and the second side plate, and the fixation member is provided with a linkage portion. The linkage member is rotatably arranged in the holding member. The linkage member comprises a docking portion and a pushing portion, and the docking portion is connected to the linkage portion. The expansion module is arranged in the holding member and connected to the pushing portion.

In some exemplary embodiments, the expansion module is provided with a connector, and the expansion module is selectively driven by the fixation member and moved along an axial direction relative to the carrier plate, when the expansion module is moved along the axial direction, the connector is inserted into a connection hole of the holding member.

In some exemplary embodiments, the expansion module is provided with a plurality of slide slots, the carrier plate is provided with a plurality of convex engaging portions, and each of the convex engaging portions is aligned with each corresponding one of the slide slots.

As above, according to some exemplary embodiments, it is easy to install the expansion module (such as, but not limited to, a circuit board) into the holding member or uninstall the expansion module from the holding member. For example, the user (or the operator) just needs to vertically place the circuit board into the holding member (or vertically take the circuit board from the holding member) and push the fixation member, and installation or uninstallation of the circuit board can be achieved. Hence, the installation time for installing the circuit board with the holding module can be reduced, and additional tools or screws are not needed for the installation or uninstallation of the circuit board. Furthermore, according to some exemplary embodiments, through the leverage linkage relationship between the first connection member and the second connection member, the circuit board can be installed or uninstalled efficiently and in a labor-saving manner through the operation of the fixation member.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
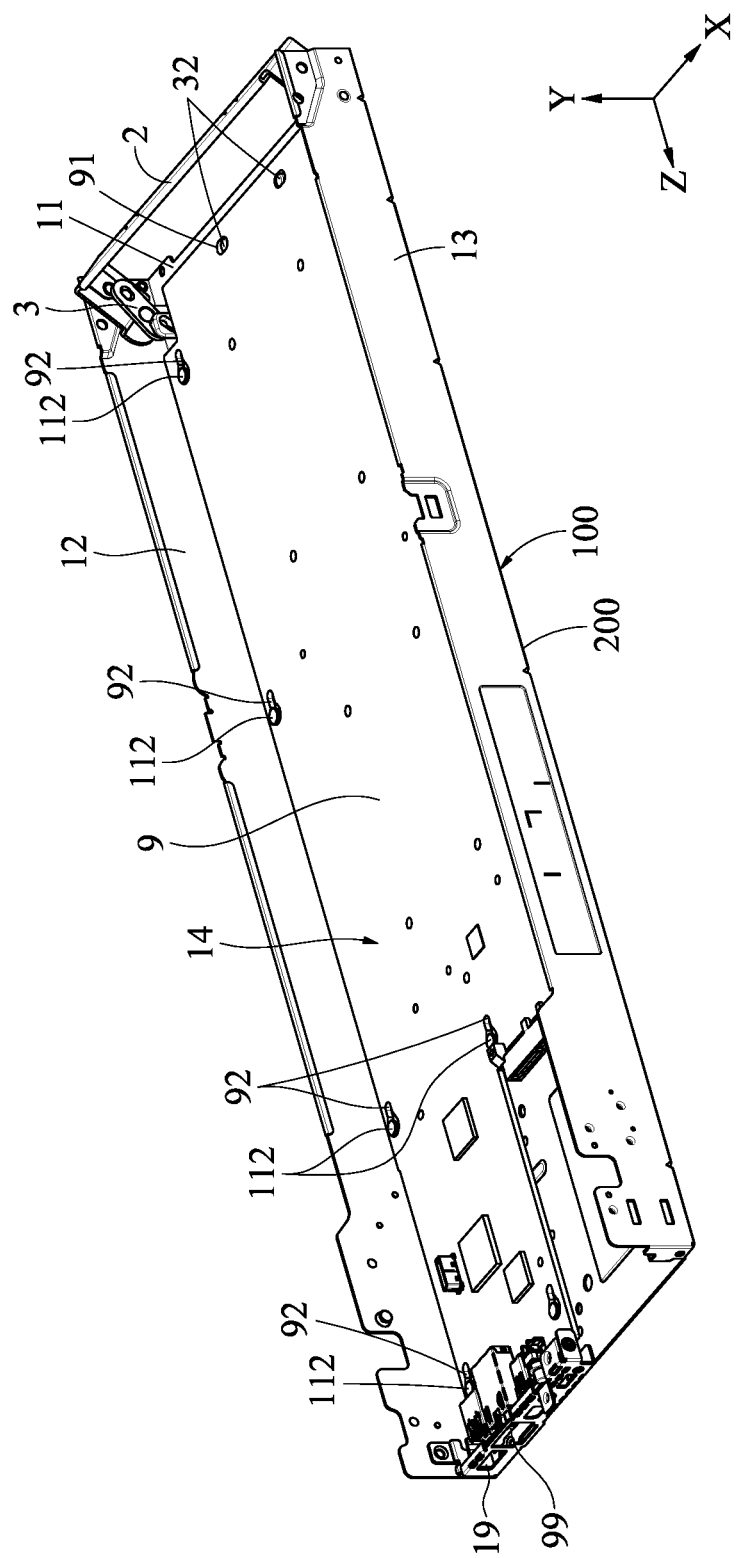
FIG. 1 illustrates a schematic perspective view of a holding module according to some exemplary embodiments of the instant disclosure, where an expansion module is installed in the holding module.

Please refer to FIG. 1. FIG. 1 illustrates a schematic perspective view of a holding module 100 according to some exemplary embodiments of the instant disclosure, where an expansion module 9 is installed in a holding member 200. In some exemplary embodiments, the holding module 100 is used to hold the expansion module 9.

Please refer to FIG. 1. In some exemplary embodiments, the holding module 100 is adapted to be installed in a cabinet adopted in a network appliance. The cabinet is provided with a plurality of sub-chassis. Each of the sub-chassis holds a plurality of the holding modules 100. The height of a server in the cabinet is presented by a unit height U (1 U is equal to 1.75 inches or 44.45 millimeters). Usually, the height of a server ranges from 1 U to 7 U, and the holding module 100 is applied to 1 U chassis. The holding module 100 can receive circuit board(s) or expansion card(s) to form an operation node or a storage node. A cabinet can contain eighty operation nodes or forty storage nodes utmost or can contain a combination of the operation nodes and the storage nodes within the height limit.

Please refer to FIG. 1. In some exemplary embodiments, the expansion module 9 may be, but not limited to, a circuit board or an expansion card, such as a peripheral component interconnect express card (PCIe card). In some exemplary embodiments, the expansion module 9 may be other devices such as, but not limited to, a hard drive. For illustration purposes, the expansion module 9 is a circuit board 9 as an example in the following descriptions, and the number given to the circuit board 9 is identical to the number given to the expansion module 9.

Figure 2:
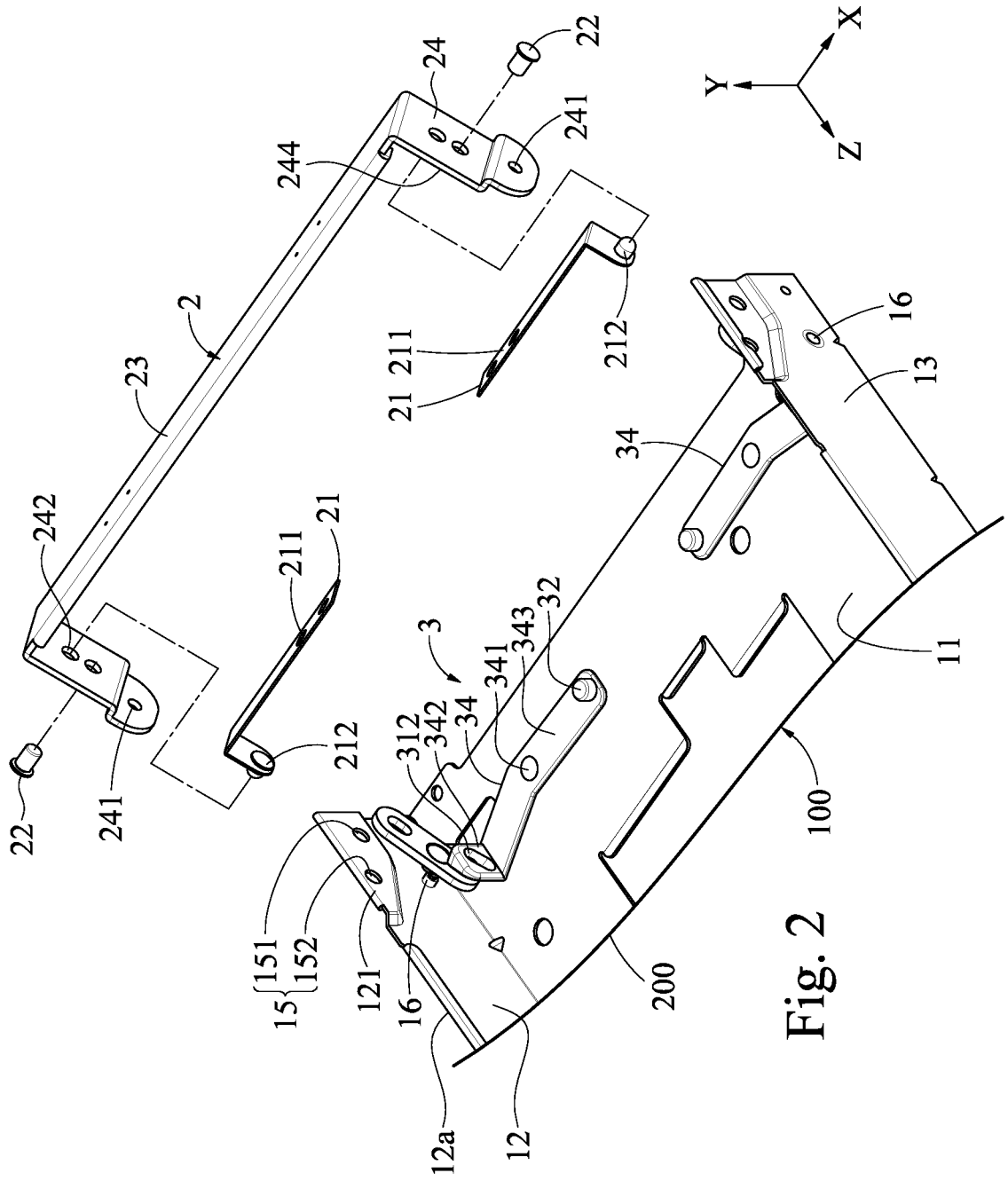
FIG. 2 illustrates a schematic partial exploded view of the holding module according to some exemplary embodiments of the instant disclosure, where two sets of linkage members are in the holding member.

Please refer to FIG. 2. FIG. 2 illustrates a schematic partial exploded view of the holding module 100 according to some exemplary embodiments of the instant disclosure, where two sets of linkage members 3 are in the holding member 200. The holding module 100 comprises the holding member 200, a fixation member 2, and a linkage member 3 (two linkage members 3 in this exemplary embodiment). The holding member 200 comprises a carrier plate 11, a first side plate 12, and a second side plate 13. The first side plate 12 and the second side plate 13 are connected to two opposite sides of the carrier plate 11, respectively, so that a storing space 14 is enclosed. The fixation member 2 is pivotally connected to the first side plate 12 and the second side plate 13. The fixation member 2 is provided with a linkage portion 22. The linkage member 3 is rotatably arranged in the holding member 200. The linkage member 3 comprises a docking portion 31 and a pushing portion 32. The docking portion 31 is connected to the linkage portion 22, and the pushing portion 32 is connected to the circuit board 9 selectively.

Figure 12:
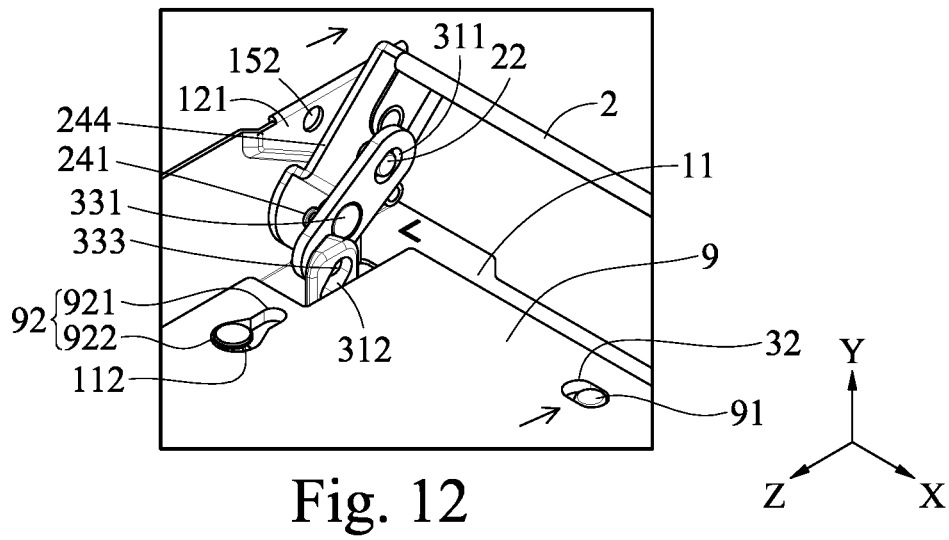
FIG. 12 illustrates a schematic enlarged partial view of the holding member according to some exemplary embodiments of the instant disclosure, showing that the fixation member is to be rotated (before rotation)
Figure 13:
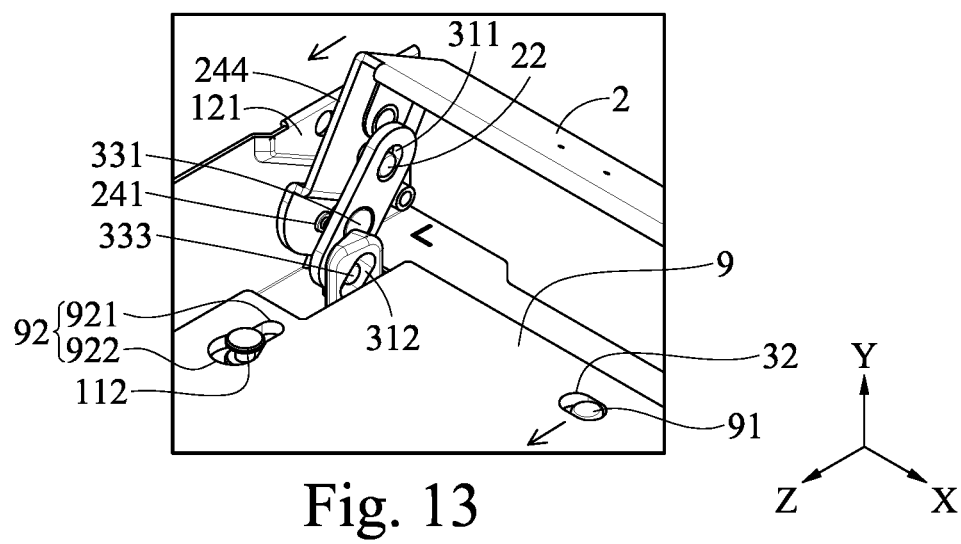
FIG. 13 illustrates a schematic enlarged partial view of the holding member according to some exemplary embodiments of the instant disclosure, showing that the fixation member is being rotated (during rotation)
Figure 14:
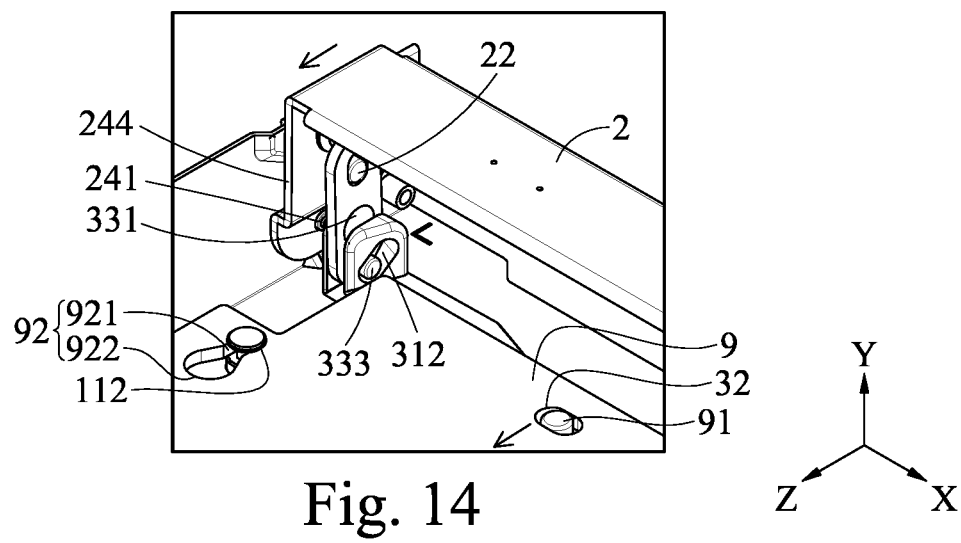
FIG. 14 illustrates a schematic enlarged partial view of the holding member according to some exemplary embodiments of the instant disclosure, showing that the fixation member has been rotated (after rotation)

After the fixation member 2 is pivotally connected to the first side plate 12 and the second side plate 13, the fixation member 2 can be rotated and thus drive the pushing member 32 of the linkage member 3 to push the circuit board 9, so that the circuit board 9 is moved between an installation position and an uninstallation position in the storage space 14 of the holding member 200 along an installing/uninstalling direction (for example, a horizontal direction, such as a third axis Z direction shown in FIG. 12 through FIG. 14). The operation is very simple, and thus, during the installation or uninstallation of the circuit board 9, the circuit board 9 can be prevented from impacting the holding member 200; thereby the possibility of damaging the circuit board 9 is reduced.

Figure 3:
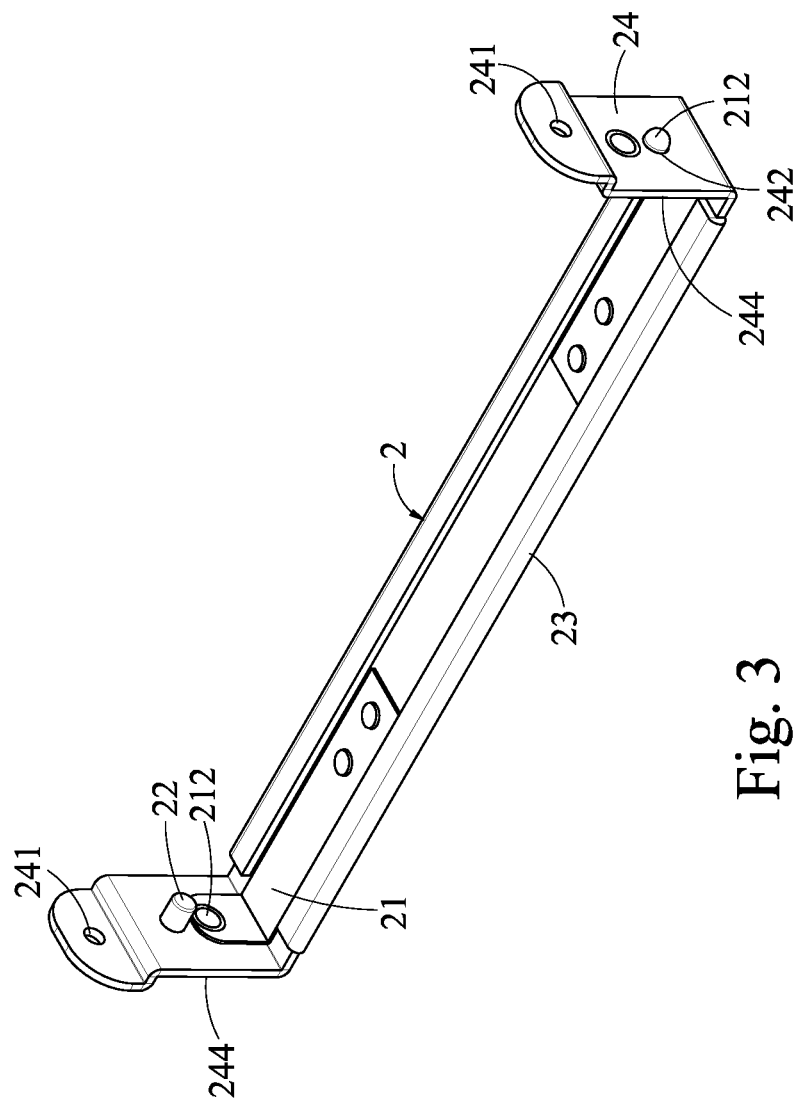
FIG. 3 illustrates a schematic perspective view of the fixation member according to some exemplary embodiments of the instant disclosure.

Please refer to FIG. 2. In some exemplary embodiments, the fixation member 2 comprises a handle 23 and two side arms 24. The handle 23 is an elongated plate. The side arms 24 are connected to two ends of the handle 23, respectively. The handle 23 and the side arms 24 together form a U-shaped structure (as shown in FIG. 3). The linkage portion 22 is arranged on at least one of the side arms 24. The linkage portion 22 may be, but not limited to, a protrusion protruding from one of the side arms 24 toward the other side arm 24. In some exemplary embodiments, the linkage portion 22 may be, but not limited to, a pin arranged through a corresponding one of the side arms 24 on the side adjacent to the first side plate 12. The two side arms 24 are provided with a plurality of the pivot portions 241. Each of the two side arms 24 is provided with a pivot portion 241, and each of the pivot portions 241 is pivotally connected to the first side plate 12 or the second side plate 12 through pivot shafts 16 respectively (the pivot shafts 16 may be, but not limited to, rivets; the rivets are pivotally connected to the first side plate 12 and the second side plate 13 along a first axis X direction, respectively). In some exemplary embodiments, each of the side arms 24 is provided with a concave portion 244. The concave portions 244 correspond to concave portions 121 of the holding member 200. A distance between the pivot portions 241 of the two side arms 24 is greater than a distance between the concave portions 244.

Figure 2A:
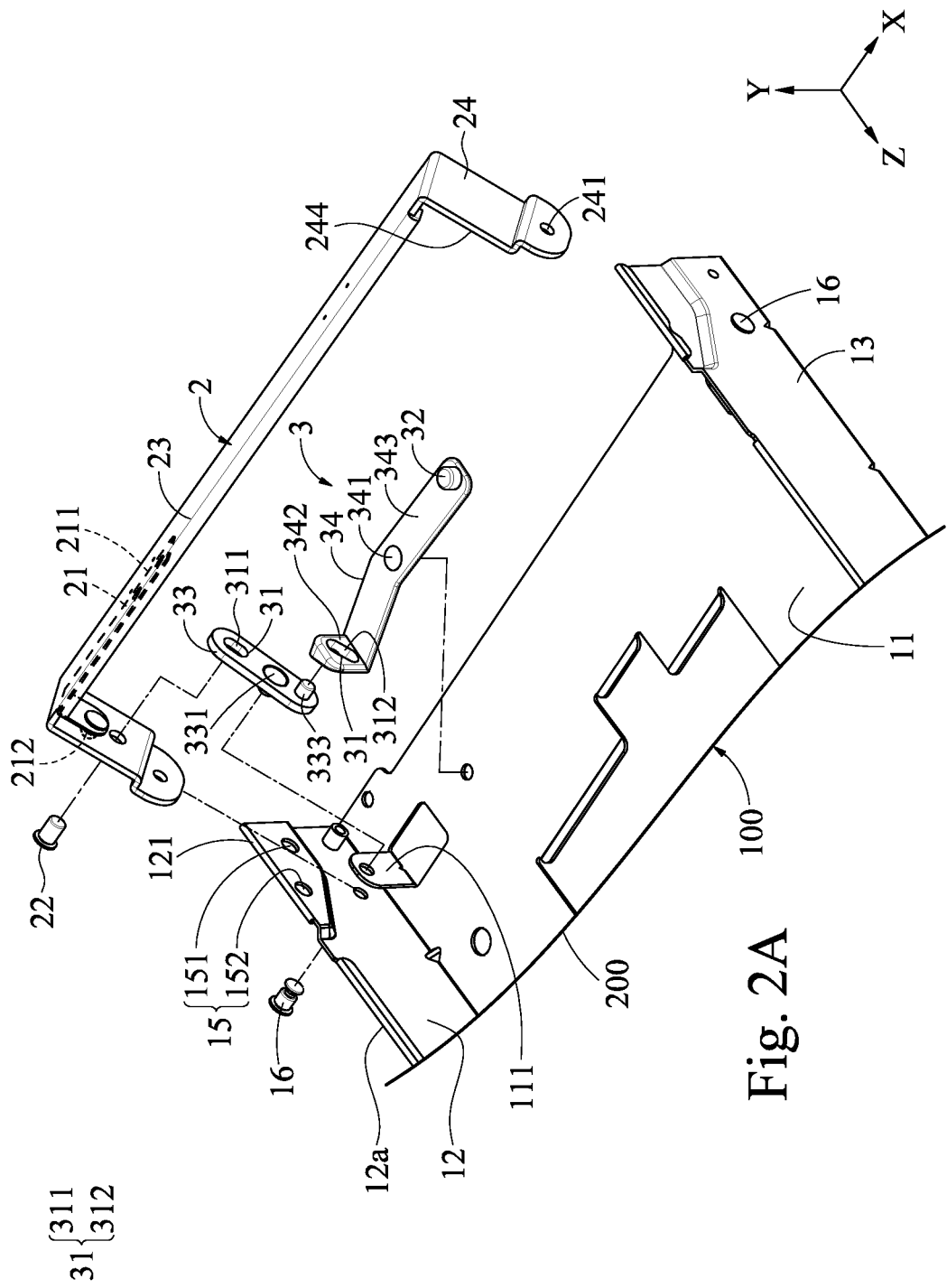
FIG. 2A illustrates a schematic partial exploded view of the holding member according to some exemplary embodiments of the instant disclosure, where one set of linkage member is in the holding member.

In some exemplary embodiments, the carrier plate 11 is provided with at least one pivot plate 111 (as shown in FIG. 2A). The pivot plate 111 protrudes from the carrier plate 11 and is adjacent to one of the first side plate 12 and the second side plate 13. The linkage member 3 is pivotally connected to the pivot plate 111. Specifically, in this embodiment, one side of the pivot plate 111 faces one of the side arms 24 of the fixation member 2, and the other side of the pivot plate 111 faces the linkage member 3. As shown in FIG. 2, in some exemplary embodiments, the carrier plate 11 is provided with two pivot plates 111, and the two pivot plates 111 are adjacent to the first side plate 12 and the second side plate 13, respectively.

Please refer to FIG. 2 to FIG. 3. In some exemplary embodiments, the fixation member 2 comprises a positioning member 21. The holding member 200 is provided with a matching member 15. One end of the positioning member 21 is a fixed end 211. The positioning member 21 is fixed at the fixation member 2 through the fixed end 211. The other end of the positioning member 21 is a free end 212. The free end 212 is moveably arranged through a through hole 242 of a corresponding one of the two side arms 24 of the fixation member 2, and the free end 212 can be selectively matched with the matching member 15. In some exemplary embodiments, the positioning member 21 is an elastic piece, the free end 212 is provided with a protrusion (not numbered), the matching member 15 is a pin hole, and the protrusion of the positioning member 21 can be selectively positioned at the matching member 15. After the protrusion of the positioning member 21 is positioned at the matching member 15, the fixation member 2 is steadily fixed in the holding member 200. Besides, after the protrusion of the positioning member 21 is positioned at the matching member 15, the fixation member 2, the first side plate 12, and the second side plate 13 are steadily connected with each other so as to increase the structural strength of the holding member 200.

Please refer to FIG. 2. In some exemplary embodiments, each of the first side plate 12 and the second side plate 13 is provided with two matching members 15. The fixation member 2 is provided with two positioning members 21 corresponding to the first side plate 12 and the second side plate 13, respectively. One of the positioning members 21 is matched with one of the two matching members 15 of the first side plate 12, and the other one of the positioning members 21 is matched with one of the two one matching members 15 of the second side plate 13.

Figure 11:
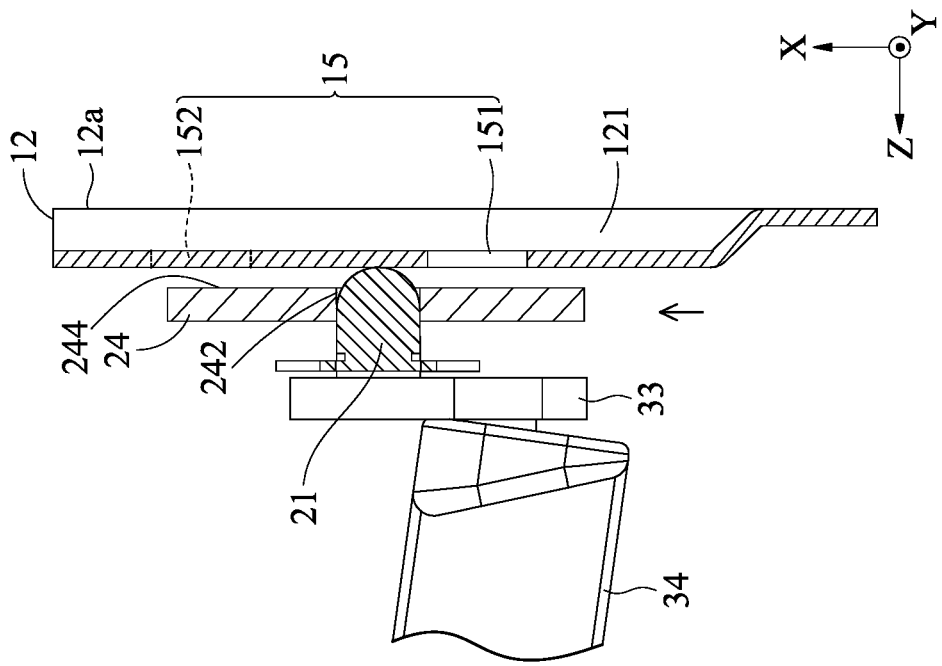
FIG. 11 also illustrates a schematic cross-sectional view along line 10-10 shown in FIG. 9, where the positioning member is not engaged with the second matching member.
Figure 10:
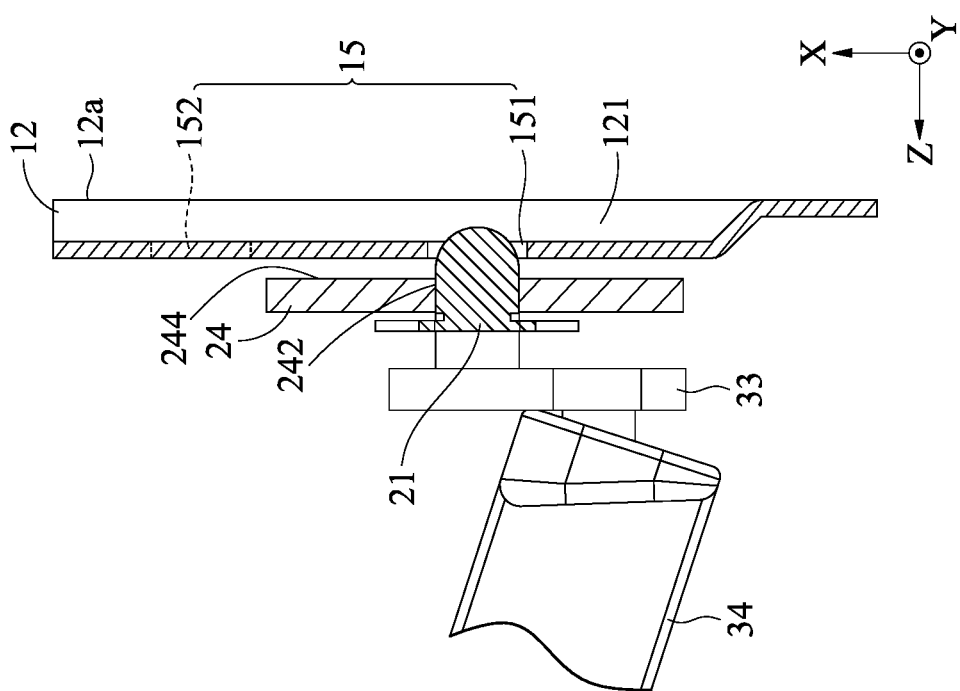
FIG. 10 illustrates a schematic cross-sectional view along line 10-10 shown in FIG. 9, where the positioning member is engaged with the second matching member.

In some exemplary embodiments, one of the first side plate 12 and the second side plate 13 is provided with a concave portion 121 (as shown in FIG. 10 and FIG. 11). The following illustration will be based on an example where the concave portion 121 is on the first side plate 12, and the example where the concave portion 121 is on the second side plate 13 is similar and thus will not be repeated. A preset horizontal distance (such as the third axis Z distance shown in FIG. 10 and FIG. 11) exists between the concave portion 121 and an outer surface 12a of the first side plate 12. The matching members 15 are on the concave portion 121. When the positioning member 21 is matched with the matching member 15, the positioning member 21 does not protrude past the outer surface 12a of the first side plate 12. In some embodiments, through the arrangement of the concave portion 121, after the holding member 200 of the holding module 100 is installed into the sub-chassis of a server, because the positioning member 21 does not protrude past the outer surface 12a of the first side plate 12, the positioning member 21 will not impact the sub-chassis. Therefore, the fixation member 2 and the circuit board 9 can be prevented from being moved by the impact of the positioning member 21.

In some exemplary embodiment, the interior of the holding module 100 may be provided with a plurality of positioning members 21, a plurality of linkage portions 22, and a plurality of linkage members 3, and the positioning members 21, the linkage portions 22, and the linkage members 3 may be correspondingly arranged on two ends of the fixation member 2 (as shown in FIG. 2), but the instant disclosure is not limited thereto. In some exemplary embodiments, the interior of the holding module 100 may be provided with just one positioning member 21, one linkage portion 22, and one linkage member 3, and the positioning member 21, the linkage portion 22, and the linkage member 3 are arranged on one end of the fixation member 2 (as shown in FIG. 2A), while no positioning member 21, no linkage portion 22, and no linkage member 3 exist on the other end of the fixation member 2 in the holding member 200.

Please refer to FIG. 2A. In some exemplary embodiments, the linkage member 3 comprises a first connection member 33 and a second connection member 34. The first connection member 33 and the second connection member 34 are both lever structures and are interlinked with each other. The first connection member 33 is provided with a first shaft portion 331, a first docking portion 311, and a resisting portion 333. The first shaft portion 331 is pivotally connected to the pivot plate 111 of the carrier plate 11, the first docking portion 311 is on one of two ends of the first shaft portion 331 and is connected to the linkage portion 22. The resisting portion 333 is on the other end of the first shaft portion 331 and is connected to the second connection member 34. The second connection member 34 is provided with a second shaft portion 341, a second docking portion 312, and a pushing portion 32. The second shaft portion 341 is pivotally connected to the carrier plate 11. The second docking portion 312 is on one of two ends of the second shaft portion 341 and is connected to the resisting portion 333. The pushing portion 32 is on the other end of the second shaft portion 341 and is adapted to drive the circuit board 9 to move.

Please refer to FIG. 2A. In some exemplary embodiments, the first docking portion 311 is a slot, the linkage portion 22 is a protrusion, and the protrusion can be moved between one of two ends of the slot and the other end of the slot, but the instant disclosure is not limited thereto. In some other exemplary embodiments, the first docking portion 311 is a protrusion, and the linkage portion 22 is a slot; similarly, the protrusion can be moved between one of two ends of the slot and the other end of the slot.

Please refer to FIG. 2A. In some exemplary embodiments, the second connection member 34 comprises a bent portion 342 and a main body 343. The bent portion 342 is on one end of the main body 343. An angular relationship exists between the bent portion 342 and the main body 343. The second docking portion 312 is located on the bent portion 342. The second docking portion 312 is a tilted slot, the resisting portion 333 is a protrusion, and the protrusion can be moved along the tiled slot, but the instant disclosure is not limited thereto. In some other exemplary embodiments, the second docking portion 312 is a protrusion, and the resisting portion 333 is a tilted slot; similarly, the protrusion can be moved along the tiled slot.

Figure 4:
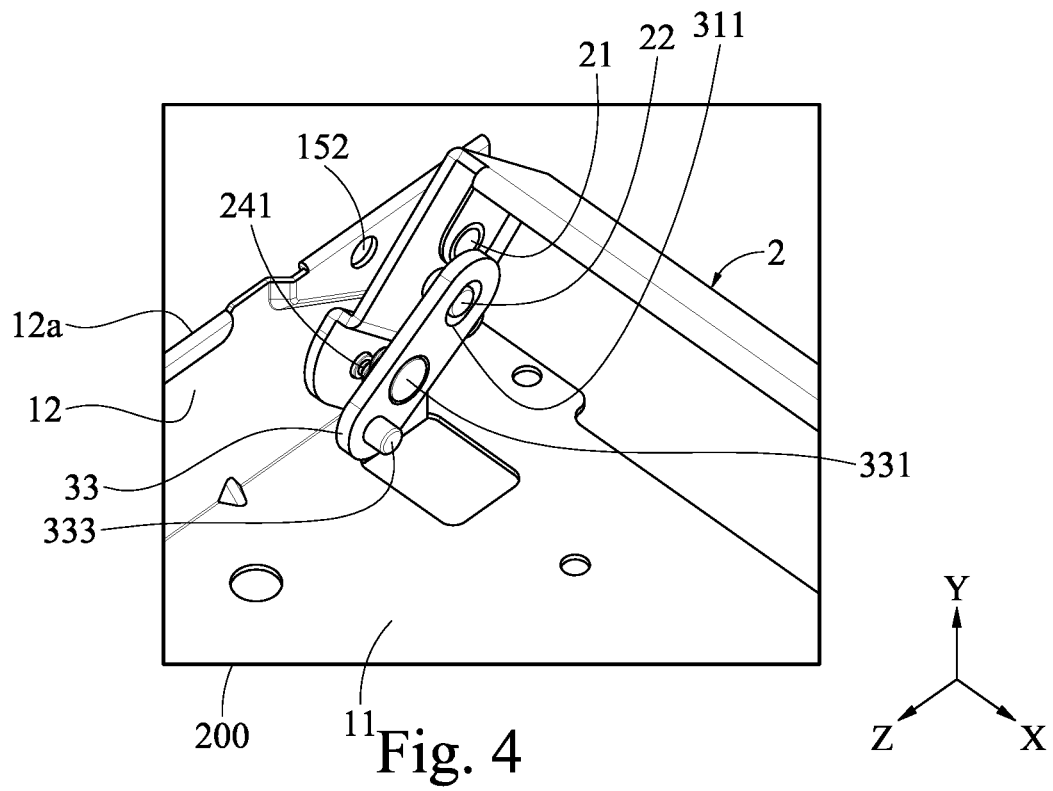
FIG. 4 illustrates a schematic partial exploded view of the holding member according to some exemplary embodiments of the instant disclosure, where the fixation member and a first connection member are installed.

Please refer to FIG. 4. FIG. 4 illustrates a schematic partial exploded view of the holding member 200 according to some exemplary embodiments of the instant disclosure, where the fixation member 2 and the first connection member 33 are installed. In some exemplary embodiments, for installing the first connection member 33 to the fixation member 2, the first shaft portion 331 is pivotally connected to the pivot plate 111 through a screw rivet, and the first docking portion 311 of the first connection member 33 is pivotally connected to the linkage portion 22 of the fixation member 2. Therefore, a linkage relationship exists between the fixation member 2 and the first connection member 33.

Figure 5:
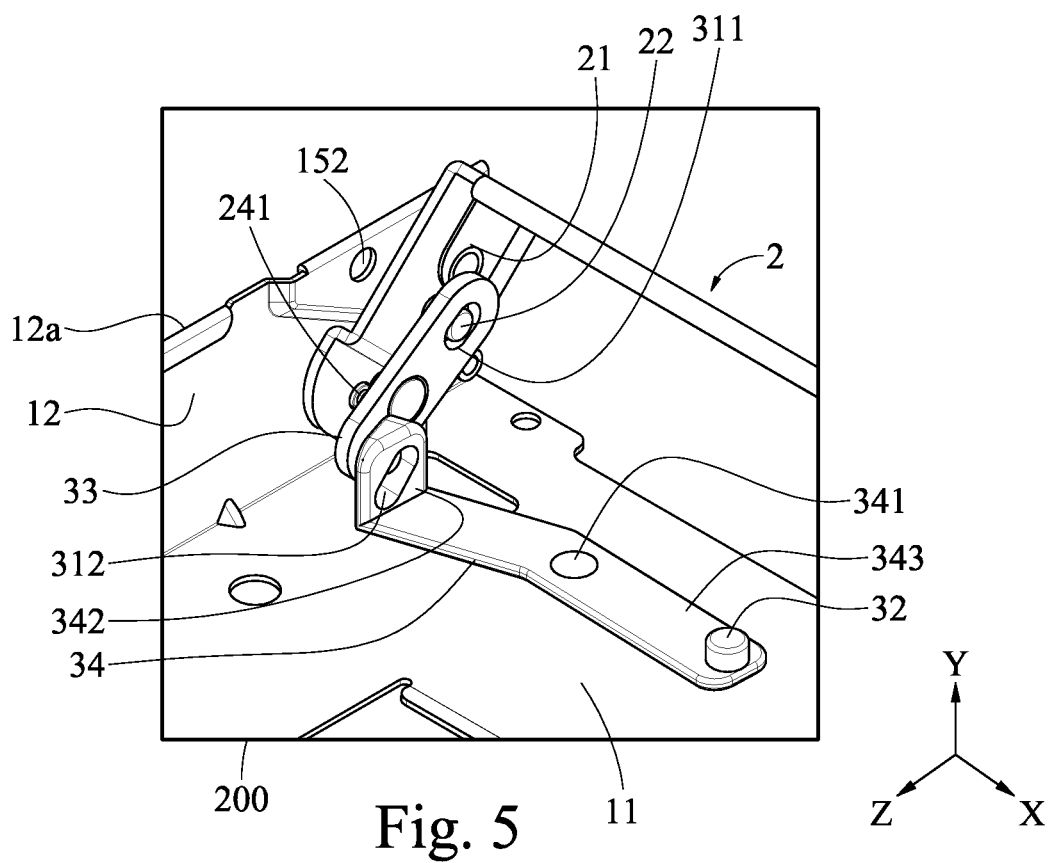
FIG. 5 illustrates a schematic partial exploded view of the holding member according to some exemplary embodiments of the instant disclosure, where a second connection member is installed.

Please refer to FIG. 5. FIG. 5 illustrates a schematic partial exploded view of the holding member 200 according to some exemplary embodiments of the instant disclosure, where the second connection member 34 is installed. In some exemplary embodiments, for installing the second connection member 34 to the first connection member 33, the second shaft portion 341 is pivotally connected to the carrier plate 11 through a screw rivet, and the second docking portion 312 of the second connection member 34 is pivotally connected to the resisting portion 333 of the first connection member 33. Therefore, a linkage relationship exists between the first connection member 33 and the second connection member 34.

Figure 6:
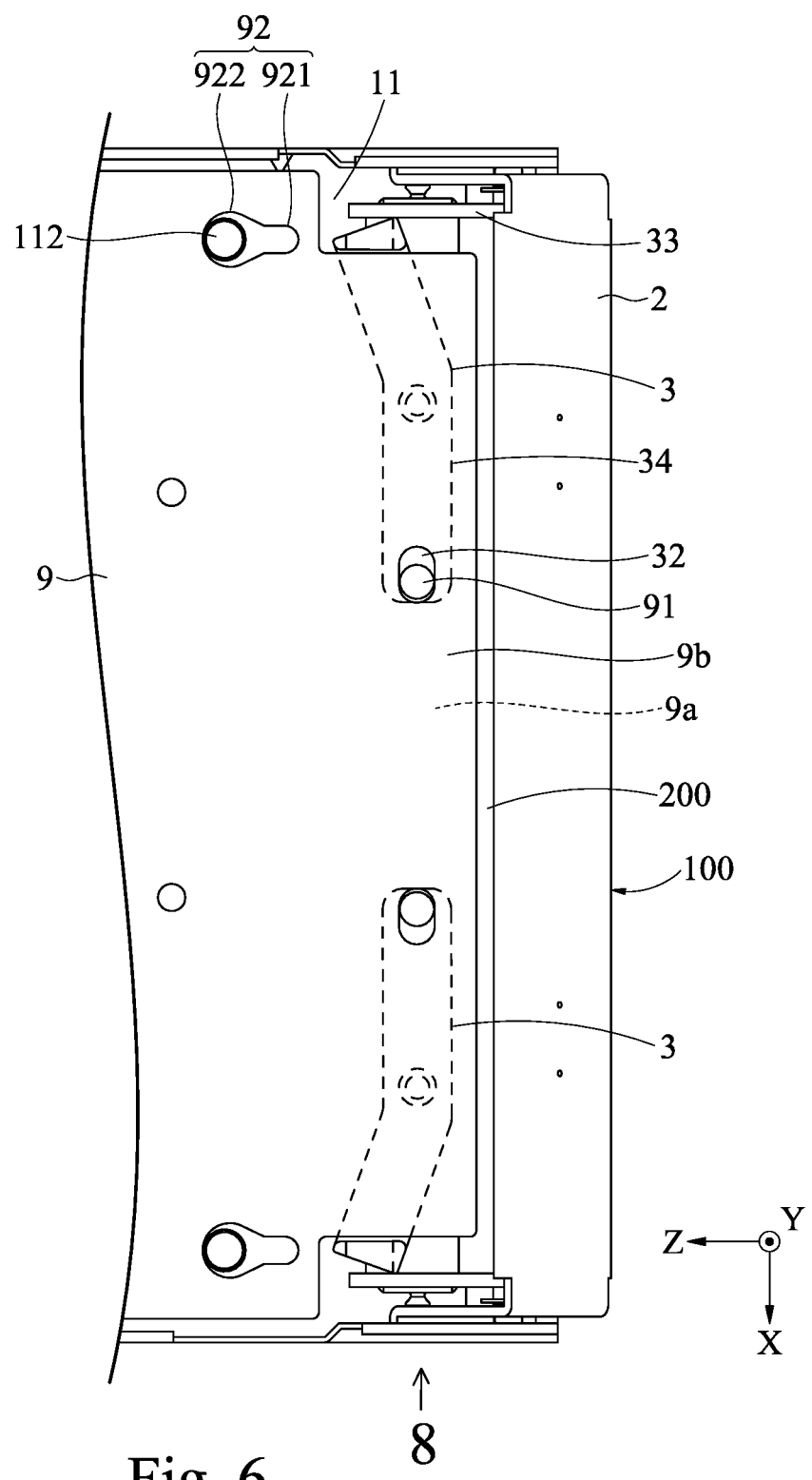
FIG. 6 illustrates a schematic partial top view of the holding module according to some exemplary embodiments of the instant disclosure, where the expansion module, the first connection member, and the second connection member are installed in the holding module, and the fixation member is at an open position (before rotation)

Please refer to FIG. 6. FIG. 6 illustrates a schematic partial top view of the holding module 100 according to some exemplary embodiments of the instant disclosure, where the expansion module 9, the first connection member 33, and the second connection member 34 are installed, and the fixation member 2 is at an open position (before rotation). In some exemplary embodiments, the pushing portion 32 of the second connection member 34 is connected to the circuit board 9. The main body 343 is limited at the bottom surface 9a of the circuit board 9, and therefore the main body 343 does not interfere with the region on a top surface 9b of the circuit board 9 where components can be placed. The circuit board 9 is provided with a docking portion 91. The docking portion 91 is connected to the pushing portion 32 of the linkage member 3 selectively. The docking portion 91 is a slot, the pushing portion 32 is a protrusion, and the protrusion can be moved along the slot, but the instant disclosure is not limited thereto. In some other exemplary embodiments, the pushing portion 32 is a slot, the docking portion 91 is a protrusion; similarly, the protrusion can be moved along the slot, but the instant disclosure is not limited thereto.

Figure 7:
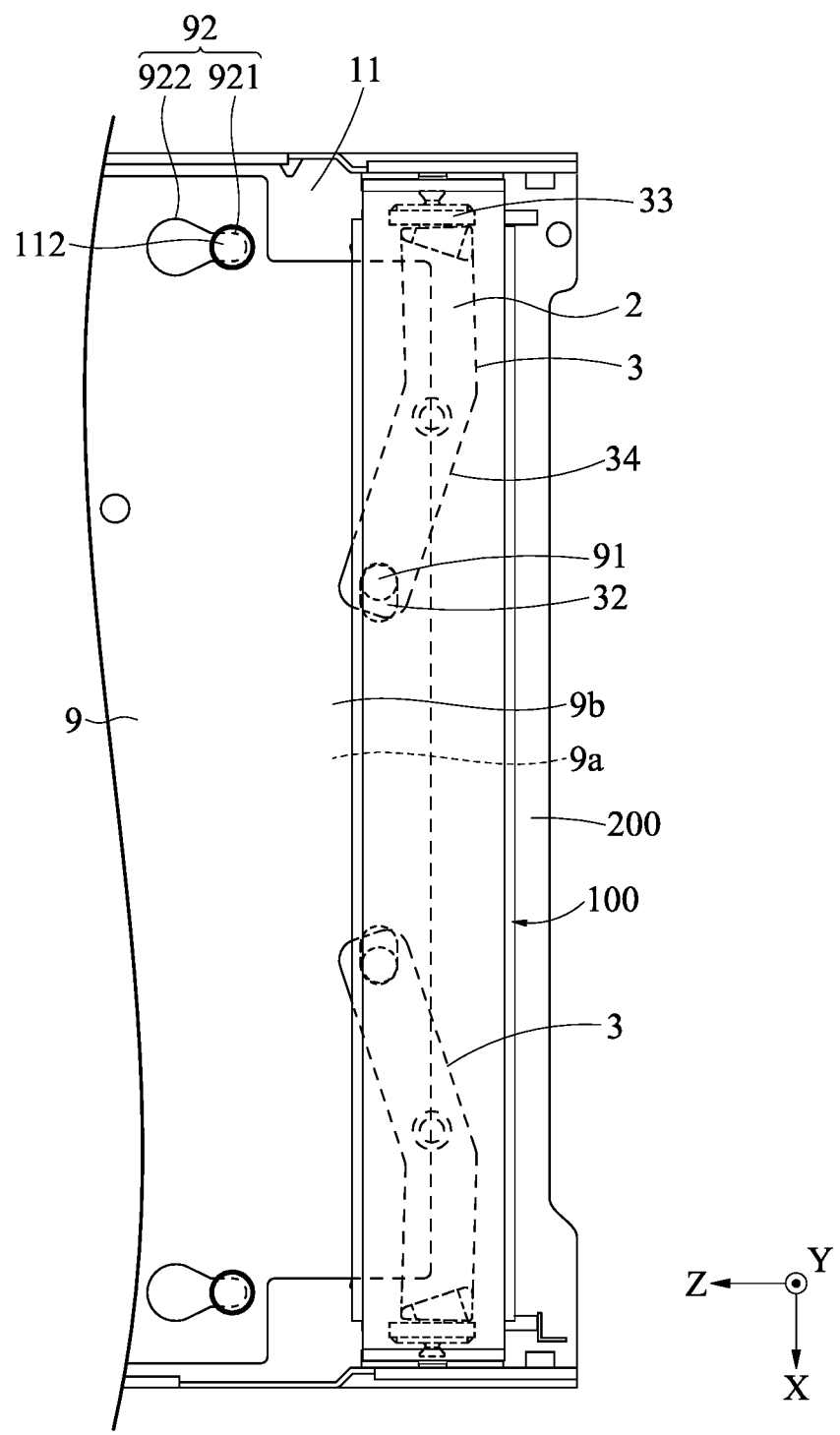
FIG. 7 illustrates a schematic partial top view of the holding module according to some exemplary embodiments of the instant disclosure, where the expansion module, the first connection member, and the second connection member are installed in the holding module, and the fixation member is at a fixed position (after rotation)
Figure 9:
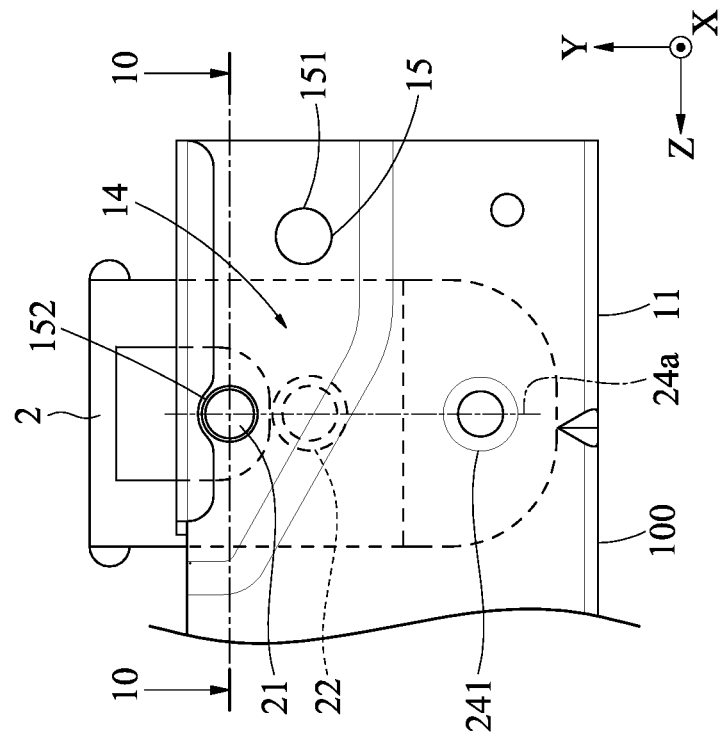
FIG. 9 also illustrates a schematic enlarged partial view of FIG. 6 from the viewing angle indicated by the arrow 8, where the fixation member is at the fixed position (after rotation)
Figure 8:
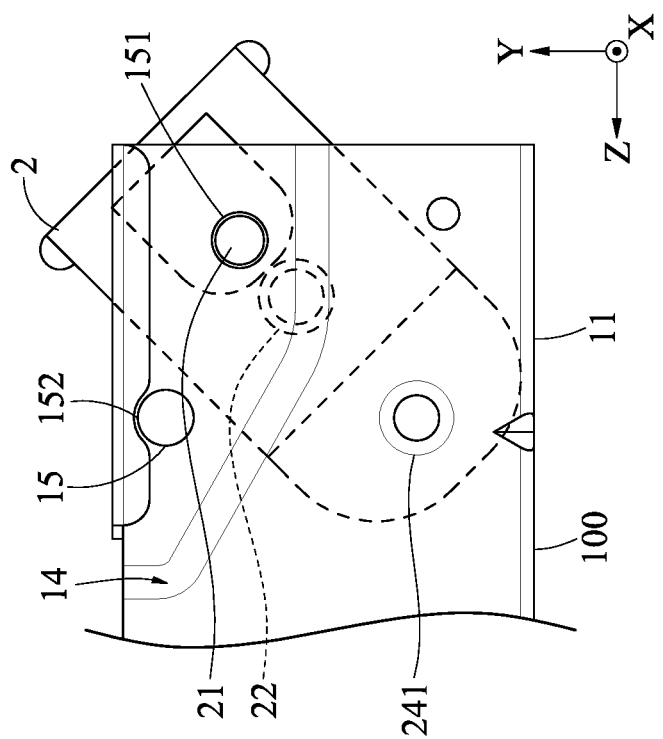
FIG. 8 illustrates a schematic enlarged partial view of FIG. 6 from the viewing angle indicated by the arrow 8, where the fixation member is at the open position (before rotation)

Please refer to FIG. 6 through FIG. 9. FIG. 7 illustrates a schematic partial top view of the holding module 100 according to some exemplary embodiments of the instant disclosure. FIG. 8 and FIG. 9 illustrate schematic enlarged partial views of the holding member 200 according to some exemplary embodiments of the instant disclosure. In FIG. 6 and FIG. 8, the fixation member 2 is at the open position. In FIG. 7 and FIG. 9, the fixation member 2 is in the fixed position. In some exemplary embodiments, through the rotation of the fixation member 2, the fixation member 2 can be moved between the open position and the fixed position. When the fixation member 2 is at the open position, the positioning member 21 is positioned at a first matching member 151. Therefore, the fixation member 2 does not interfere with the storing space 14, and thus the circuit board 9 can be placed into the storing space 14 of the holding member 200. At the same time, the docking portion 91 of the circuit board 9 is matched with the pushing portion 32 of the linkage member 3. When a user (or an operator) moves the fixation member 2 from the open position to the fixed position, the fixation member 2 is rotated away from the carrier plate 11, the positioning member 21 of the fixation member 2 is detached from the first matching member 151, the fixation member 2 drives the pushing portion 32 of the linkage member 3 to move (as shown in FIG. 12 through FIG. 14), and the pushing portion 32 drives the circuit board 9 to move along the installation/uninstallation direction (such as the third axis Z shown in FIG. 12 through FIG. 14) of the carrier board 11. When the fixation member 2 is at the fixed position, the positioning member 21 of the fixation member 2 is positioned at a second matching member 152. At the same time, the circuit board 9 is limited in the storing space 14 of the holding member 200, and the fixation member 2 is fixed above the storing space 14 between the first side plate 12 and the second plate 13 and is positioned at the fixed position so as to ensure the structural strength of the holding member 200.

In some exemplary embodiments, because the circuit board 9 is vertically installed on the carrier plate 11 (for example, the circuit board 9 is installed on the carrier plate along a second axis Y direction shown in FIG. 6), the circuit board 9 can be kept from impacting the holding member 200 (for example, the side portion of the circuit board 9 impacts the first side plate 12 and the second side plate 13) during the installation of the circuit board 9, so that the components on the circuit board 9 is not prone to be worn and torn. Besides, because the fixation member 2 is positioned at the fixed position, the structural strength of the holding member 200 can be ensured, and the holding module 100 can be prevented from being deformed upon an external force applied to the holding module 100.

Please refer to FIG. 8. In some exemplary embodiments, when the fixation member 2 is at the open position, the positioning member 21 is detached from the second matching member 152 and is matched with the first matching member 151, and the fixation member 2 is away from the storing space 14 between the first side plate 12 and the second side plate 13 (as shown in FIG. 6). As a result, the installation or uninstallation of the circuit board 9 can be performed.

In some exemplary embodiments, a line connecting between the positioning member 21 and the pivot portion 241 of the fixation member 2 is an axial line 24a (as shown in FIG. 9). When the fixation member 2 is at the fixed state, the axial line 24a is perpendicular to the carrier plate 11, and the linkage portion 22 is between the pivot portion 241 and the positioning member 21 and is aligned with the axial line 24a.

Please refer to FIG. 1. In some exemplary embodiments, the circuit board 9 is provided with a plurality of slide slots 92. Each of the slide slots 92 comprises a smaller slot 921 and a bigger slot 922 (as shown in FIG. 6). The smaller slot 921 and the bigger slot 922 together form a pear-shaped slot. The carrier plate 11 is provided with a plurality of convex engaging portions 112, and each of the convex engaging portions 112 matches with a corresponding one of the slide slots 92 (as shown in FIG. 12 through FIG. 14).

The following paragraphs will illustrate the operation of installing the circuit board 9 with the holding module 100 according to some exemplary embodiments. In some exemplary embodiments, upon installation of the circuit board 9 with the holding module 100, the circuit board 9 is first vertically (such as along the second axis Y direction shown in FIG. 12) placed into the storing space 14 of the holding module 100, each of the convex engaging portions 112 is arranged through a corresponding one of the bigger slots 922 of the circuit board 9 (as shown in FIG. 12), and the docking portion 91 of the circuit board 9 is matched with the pushing portion 32 of the linkage member 3. Next, the fixation member 2 is rotated away from the carrier plate 11, and the linkage portion 22 of the fixation member 2 drives the linkage member 3 to rotate, so that the pushing portion 32 of the linkage member 3 drives the docking portion 91 of the circuit board 9 to move away from the fixation member 2 along the installation/uninstallation direction. As a result, the circuit board 9 is moved from the uninstallation position to the installation position, each of the convex portions 122 is engaged with a corresponding one of the smaller slots 921 (as shown in FIG. 14), and thus the circuit board 9 is fixed on the carrier plate 11.

Upon uninstalling the circuit board 9 from the holding module 100, the fixation member 2 is rotated toward the carrier plate 11 (as shown in FIG. 12), the fixation member 2 drives the linkage member 3 to rotate, thus the linkage member 3 drives the circuit board 9 to move, and the pushing portion 32 of the linkage member 3 pushes the docking portion 91 of the circuit board 9 so that the circuit board 9 is moved toward the fixation member 2 along the installation/uninstallation direction. After the circuit board 9 is moved from the installation position to the uninstallation position, and the convex engaging portions 112 on the carrier plate 11 is moved to the bigger slots 922 of the circuit board 9, the circuit board 9 can be detached from the carrier plate 11, and the circuit board 9 can be vertically taken out of the holding member 200.

Figure 15:
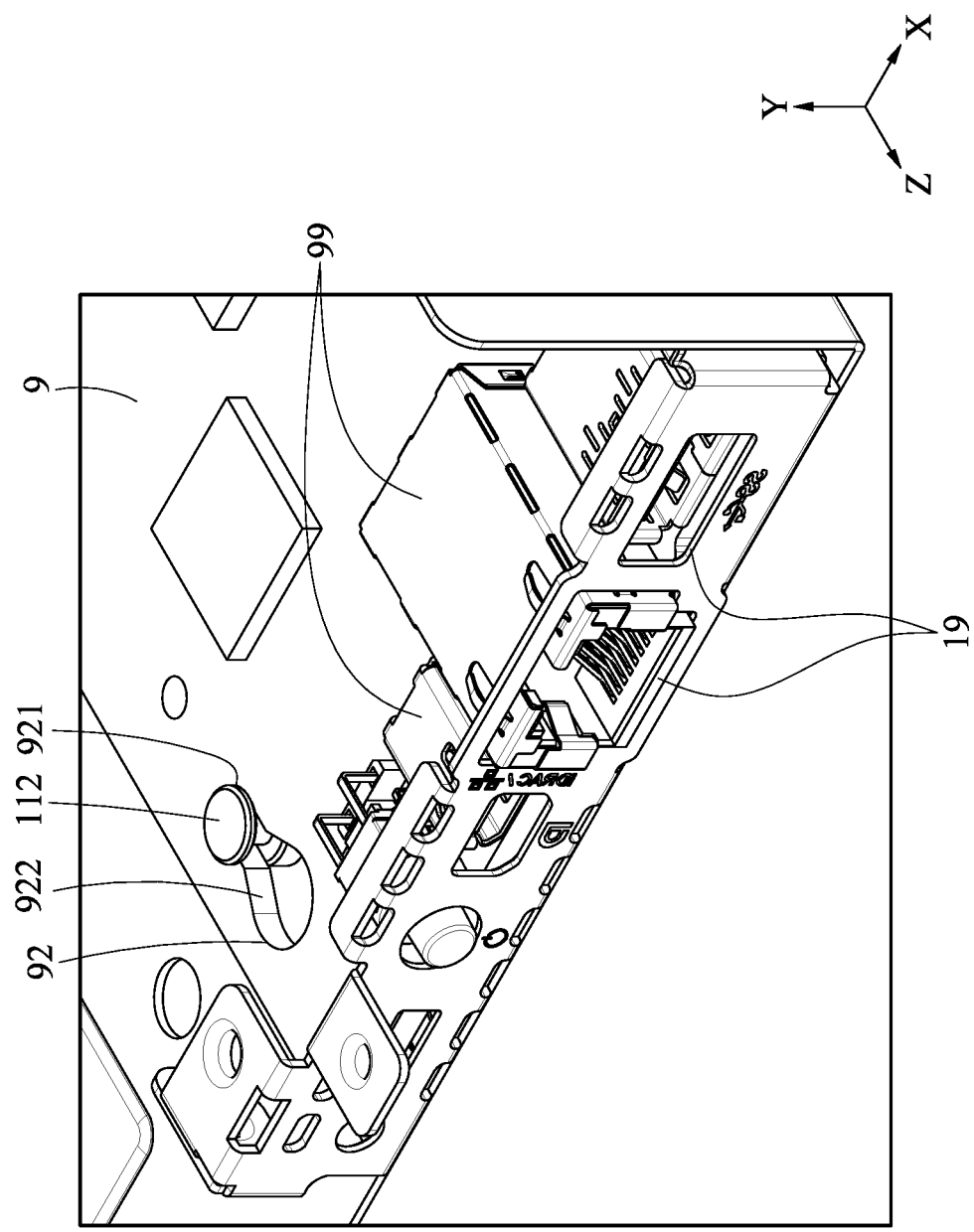
FIG. 15 illustrates a schematic enlarged partial view of the holding member according to some exemplary embodiments of the instant disclosure, showing that after the fixation member is rotated, the fixation member has driven a connector of a circuit board to be inserted into a connection hole of the holding member.

In some exemplary embodiments, after the fixation member 2 is pushed to drive the circuit board 9 to move from the uninstallation position to the installation position, a connector 99 provided to the circuit board 9 is inserted into and positioned at a connection hole 19 of the holding member 200 (as shown in FIG. 15). Furthermore, after the circuit board 9 is moved from the installation position to the uninstallation position, the connector 99 of the circuit board 9 is detached from the connection hole 19 of the holding member 200. Therefore, in some embodiments, to achieve the installation or uninstallation of the circuit board 9, the user (or the operator) just needs to place the circuit board 9 in the holding member 200 vertically (or take the circuit board 9 from the holding member 200 vertically) and to push the fixation member 2. Hence, the installation time for installing the circuit board 9 with the holding module 100 can be reduced, and additional tools or screws are not needed for the installation or uninstallation of the circuit board 9. Furthermore, according to some exemplary embodiments, through the leverage linkage relationship between the first connection member 33 and the second connection member 34, the circuit board 9 can be installed or uninstalled efficiently and in a labor-saving manner through the operation of the fixation member 2.

Figure 16:
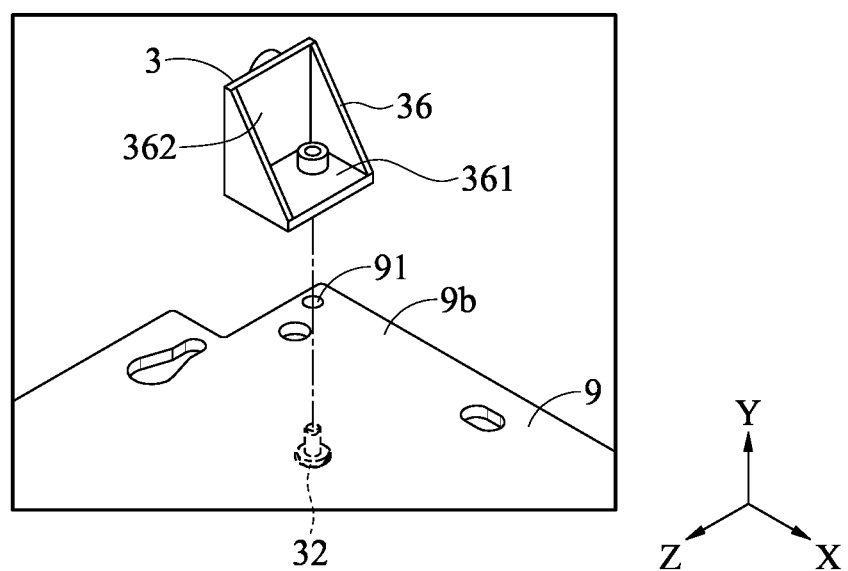
FIG. 16 illustrates a schematic enlarged partial view of the circuit board and a connection base according to some exemplary embodiments of the instant disclosure, where the connection base is locked on the circuit board through a locking member.
Figure 17:
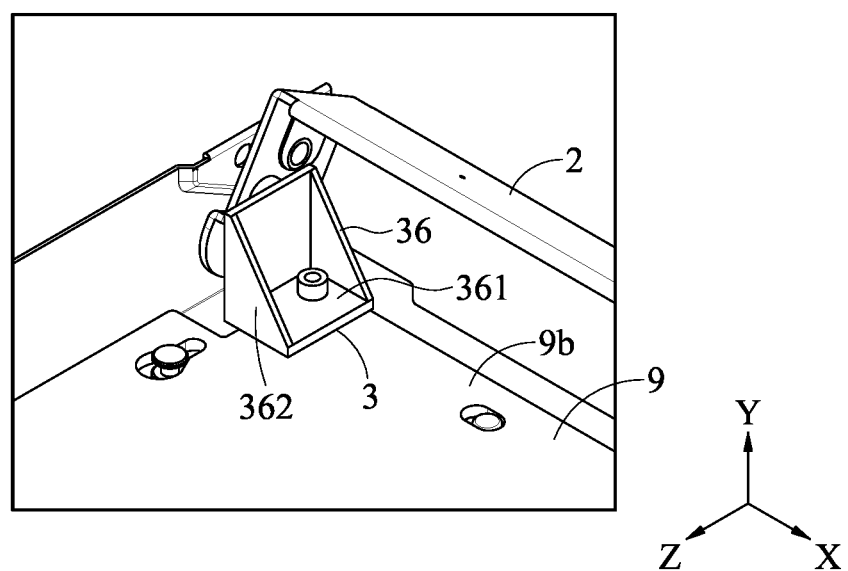
FIG. 17 illustrates a schematic enlarged partial view of the holding member according to some exemplary embodiments of the instant disclosure, where the connection base shown in FIG. 16 is assembled with the circuit board.
Figure 19:
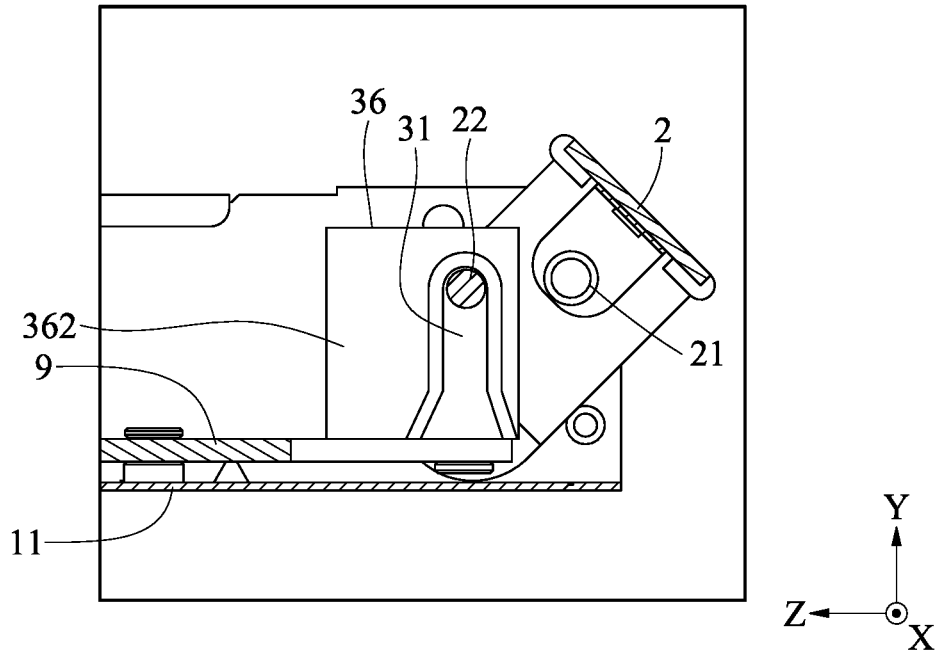
FIG. 19 illustrates a schematic cross-sectional view along line 19-19 shown in FIG. 18, where the fixation member is at the open position (before rotation)

In some exemplary embodiments, the linkage member 3 is a two-piece structure comprising the first connection member 33 and the second connection member 34 to drive the circuit board 9 to move (as shown in FIG. 2 and FIG. 2A), but the instant disclosure is not limited thereto. In some other exemplary embodiments, the linkage member may be a connection base 36 (as shown in FIG. 16 and FIG. 17), which is a one-piece structure. The connection base 36 is provided with a docking portion 31 (as shown in FIG. 19). The docking portion 31 is a slot, the linkage portion 22 is a protrusion, and the protrusion can pivot-shift along the slot, but the instant disclosure in not limited thereto. In some other exemplary embodiments, the linkage portion 22 is a slot, and the docking portion 31 is a protrusion; similarly, the protrusion can pivot-shift along the slot.

In this embodiment, the pivot-shift relationship between the connection base 36 and the fixation member 2 may refer to, but not limited to, that the connection base 36 and the fixation member 22 can pivotally rotate relative to each other (i.e., the connection base 36 and the fixation member 22 are pivotally connected to each other) or that the connection base 36 and the fixation member 22 can be moved relative to each other.

Please refer to FIG. 16 and FIG. 17. FIG. 16 illustrates a schematic enlarged partial view of the circuit board 9 and the connection base 36 according to some exemplary embodiments of the instant disclosure, where the connection base 36 is fixed on the circuit board 9 through a locking member (the pushing portion 32). FIG. 17 illustrates a schematic enlarged partial view of the holding member 200 according to some exemplary embodiments of the instant disclosure, where the connection base 36 shown in FIG. 16 is assembled with the top surface 9b of the circuit board 9. In some exemplary embodiments, the connection base 36 has a bottom plate 361 and a side plate 362. An angular relationship exists between the bottom plate 361 and the side plate 362. The bottom plate 361 is provided with the pushing portion 32. The pushing portion 32 is connected to the circuit board 9 selectively so that the bottom plate 361 is fixed at the top surface 9b of the circuit board 9, but the instant disclosure is not limited thereto. In some other exemplary embodiments, the bottom plate 361 may be fixed at the bottom surface 9a of the circuit board 9 (as shown in FIG. 16B, where the bottom plate 361 is fixed at the bottom surface 9a of the circuit board 9 after installation).

Figure 18:
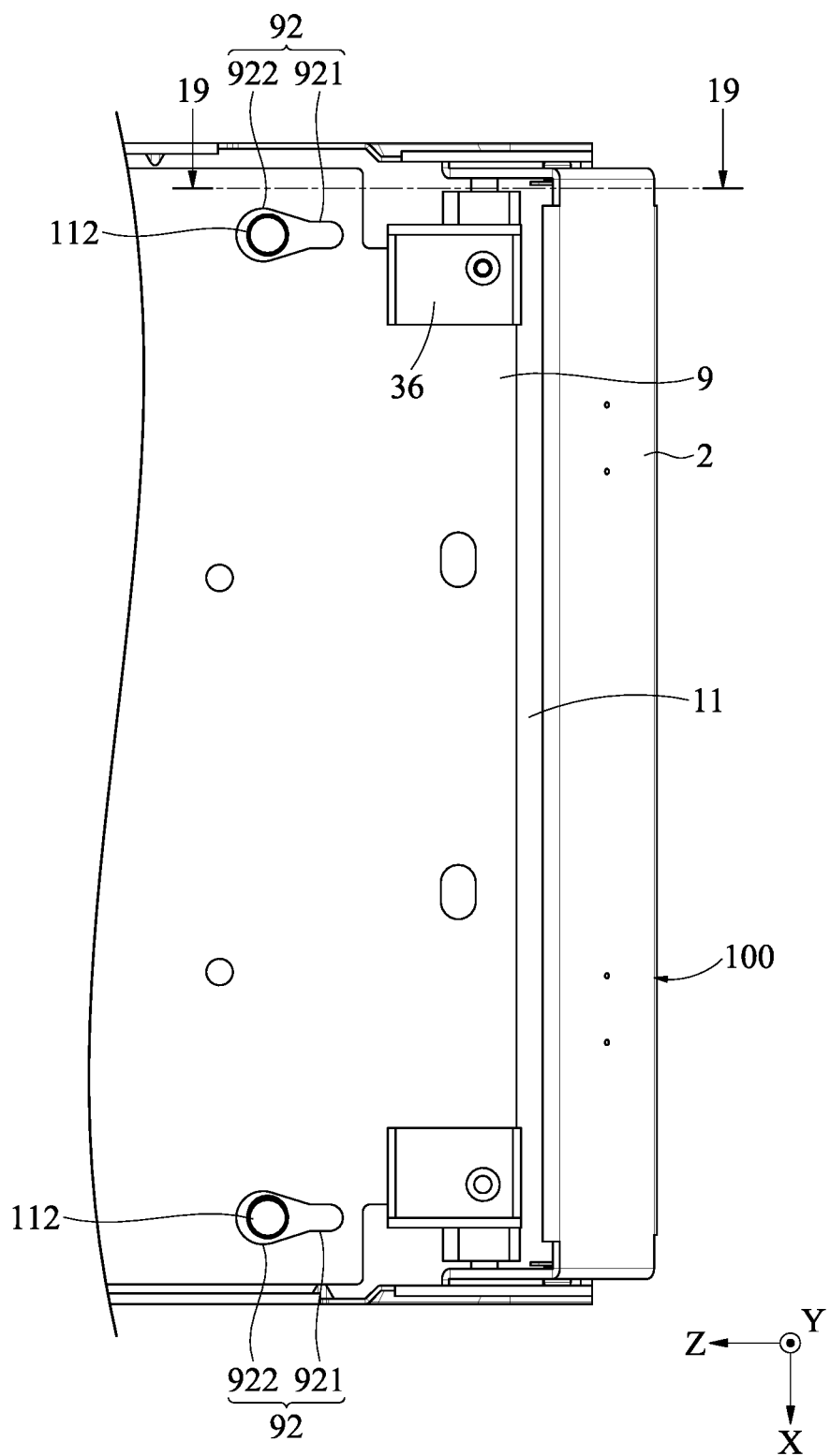
FIG. 18 illustrates a schematic partial top view of the holding member according to some exemplary embodiments of the instant disclosure, where the expansion module and the connection base are installed in the holding member.
Figure 20:
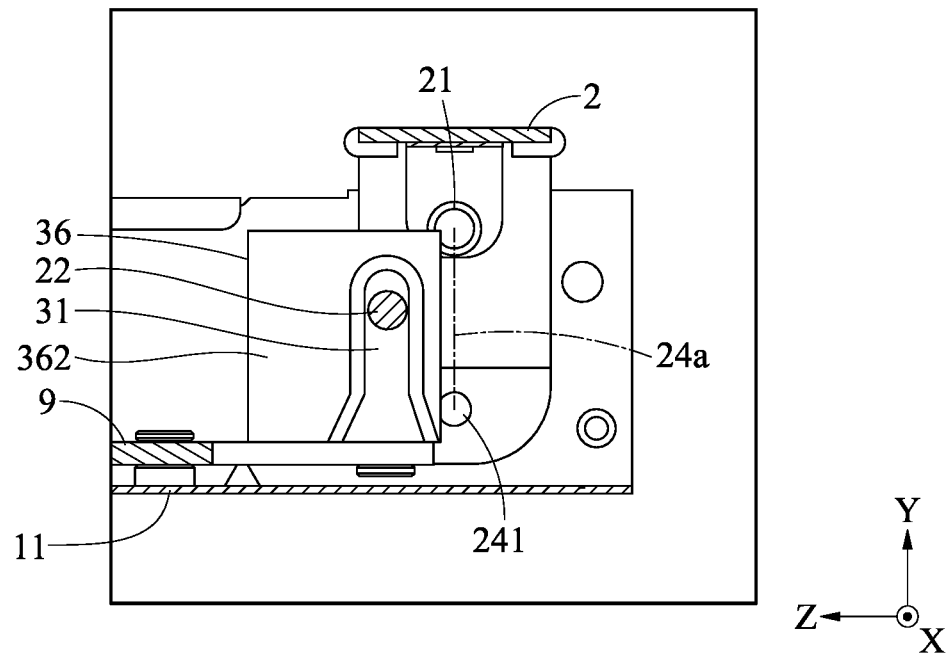
FIG. 20 also illustrates a schematic cross-sectional view along line 19-19 shown in FIG. 18, where the fixation member is at the fixed position (after rotation)

Please refer to FIG. 18 through FIG. 20. FIG. 18 illustrates a schematic partial top partial view of the holding member 200 according to some exemplary embodiments of the instant disclosure, where the expansion module 9 and the connection base 36 are installed in the holding member 200. FIG. 19 illustrates a schematic cross-sectional view along line 19-19 shown in FIG. 18, where the fixation member 2 is at the open position (before rotation). FIG. 20 also illustrates a schematic cross-sectional view along line 19-19 shown in FIG. 18, where the fixation member 2 is at the fixed position (after rotation). In some exemplary embodiments, when the circuit board 9 is vertically placed into the holding member 200, the docking portion 31 of the connection base 36 is aligned with and engaged with the linkage portion 22 of the fixation member 2. Then, the fixation member 2 is rotated so as to drive the linkage member 3 and the circuit board 9 to move, so that each of the convex engaging portions 112 is engaged with a corresponding one of the smaller slots 921 on the circuit board 9 (as shown in FIG. 14, where the convex engaging portions 112 are engaged with the smaller slots 921 when the circuit board 9 is at the installation position). As a result, the circuit board 9 is positioned on the carrier plate 11.

Please refer to FIG. 20. In some exemplary embodiments, a line connecting between the positioning member 21 and the pivot portion 241 of the fixation member 2 is the axial line 24a. When the fixation member 2 is at the fixed position, the axial line 24a is perpendicular to the carrier plate 11, the docking portion 31 is parallel to the axial line 24a, and the linkage portion 22 is on the side plate 362 and misaligned with the axial line 24a.

Figure 16A:
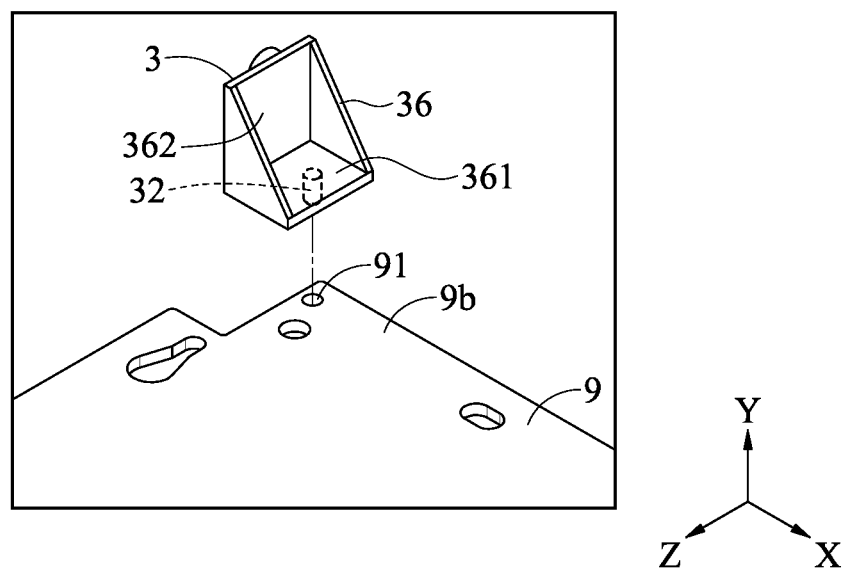
FIG. 16A illustrates a schematic enlarged partial view of the circuit board and the connection base according to some exemplary embodiments of the instant disclosure, where a protrusion protrudes from the bottom of a base plate of the connection base.
Figure 16B:
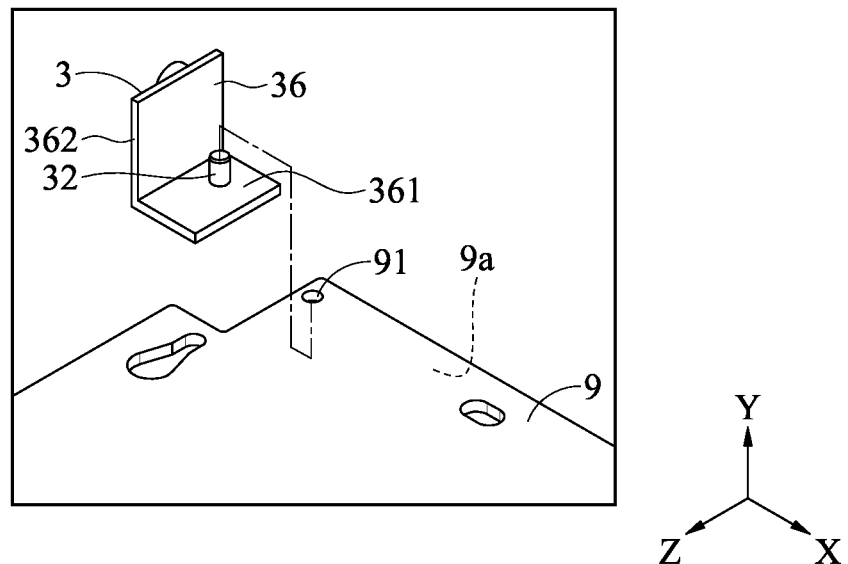
FIG. 16B illustrates a schematic enlarged partial view of the circuit board and the connection base according to some exemplary embodiments of the instant disclosure, where a protrusion protrudes from the top of the base plate of the connection base.

In some exemplary embodiments, the pushing portion 32 is a locking member (such as the screw shown in FIG. 16) or a protrusion (as shown in FIG. 16A and FIG. 16B), the circuit board 9 is provided with a pin hole, and the locking member or the protrusion is assembled with the pin hole. In an exemplary embodiment where the connection base 36 is a die casting component, the pushing portion 32 is locked at the pin hole of the circuit board 9 through the locking member, so that the bottom plate 361 of the connection base 36 is fixed at the top surface 9b of the circuit board 9 (as shown in FIG. 17). In an exemplary embodiment where the connection base 36 is a plastic component, a protrusion protrudes from the bottom plate 361 of the connection base 36 (as shown in FIG. 16A and FIG. 16B), and the protrusion has a reverse hook so as to be engaged with the pin hole of the circuit board 9, so that the bottom plate 361 of the connection base 36 is fixed at the top surface 9b of the circuit board 9 (as shown in FIG. 16A) or the bottom surface 9a of the circuit board 9 (as shown in FIG. 16B). In the exemplary embodiment where the bottom plate 361 of the connection base 36 is fixed at the bottom surface 9a of the circuit board 9, the available space for components on the top surface 9b of the circuit board 9 is increased.

Figure 21:
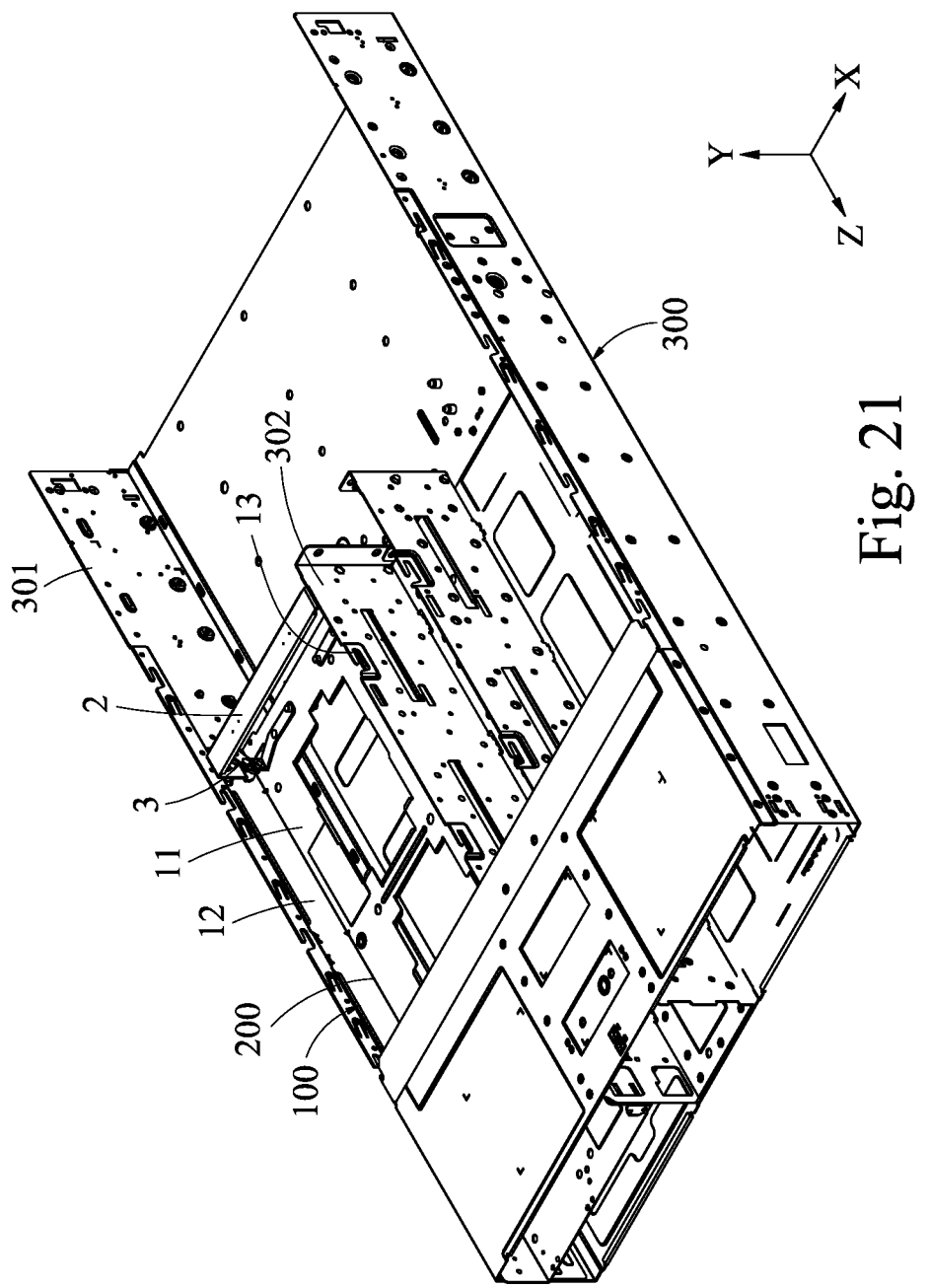
FIG. 21 illustrates a schematic perspective view of an electronic device according to some exemplary embodiments of the instant disclosure, where the holding module is installed in a chassis and the expansion module is not installed in the holding member.

Please refer to FIG. 21. FIG. 21 illustrates a schematic perspective view of an electronic device 300 according to some exemplary embodiments of the instant disclosure. In some exemplary embodiments, the holding module 100 is installed in a chassis 301 of the electronic device 300, as shown in FIG. 21. The holding module 100 is installed on one side of the interior of the chassis 301. The first side plate 12 of the holding member 200 of the holding module 100 is connected to a side wall of the chassis 301, and the second side plate 13 of the holding member 200 of the holding module 100 is connected to a separation board 302 in the interior of the chassis 301.

As above, according to some exemplary embodiments, it is easy to install the expansion module (such as, but not limited to, a circuit board) into the holding member or uninstall the expansion module from the holding member. For example, the user (or the operator) just needs to vertically place the circuit board into the holding member (or vertically take the circuit board from the holding member) and push the fixation member, and installation or uninstallation of the circuit board can be achieved. Hence, the installation time for installing the circuit board with the holding module can be reduced, and additional tools or screws are not needed for the installation or uninstallation of the circuit board. Furthermore, according to some exemplary embodiments, through the leverage linkage relationship between the first connection member and the second connection member, the circuit board can be installed or uninstalled efficiently and in a labor-saving manner through the operation of the fixation member.

What is claimed is:

1. A holding module adapted to hold an expansion module comprising:
    a holding member comprising a carrier plate, a first side plate, and a second side plate, wherein the first side plate and the second side plate are connected to two opposite sides of the carrier plate, respectively;
    a fixation member pivotally connected to the first side plate and the second side plate, wherein the fixation member is provided with a linkage portion; and
    a linkage member rotatably arranged in the holding member, wherein the linkage member comprises a docking portion and a pushing portion, the docking portion is connected to the linkage portion, and the pushing portion is connected to the expansion module selectively.

2. The holding module according to claim 1, wherein the fixation member further comprises a positioning member, the holding member is provided with a matching member, and the positioning member matches with the matching member selectively.

3. The holding module according to claim 2, wherein the fixation member comprises a handle and two side arms respectively connected to two ends of the handle, the two side arms are provided with a plurality of the pivot portions, each of the two side arms is provided with a pivot portion, and each of the pivot portions is pivotally connected to the first side plate or the second side plate respectively.

4. The holding module according to claim 3, wherein in each of the side arms, a line connecting between the positioning member and the pivot portion is an axial line, and the linkage portion is between the positioning member and the pivot portion, and aligned with the axial line.

5. The holding module according to claim 1, wherein the linkage member comprises a first connection member and a second connection member; the first connection member is provided with a first shaft portion, a first docking portion, and a resisting portion, the first shaft portion is pivotally connected to a pivot plate of the carrier plate, the first docking portion and the resisting portion are respectively on two opposite ends of the first shaft portion, and the first docking portion is moveably connected to the linkage portion; the second connection member is provided with a second shaft portion, a second docking portion, and a pushing portion, the second shaft portion is pivotally connected to the carrier plate, the second docking portion and the pushing portion are respectively on two opposite ends of the second shaft portion, the second docking portion is moveably connected to the resisting portion, and the pushing portion is connected to the expansion module selectively.

6. The holding module according to claim 5, wherein the second connection member comprises a bent portion and a main body, the bent portion and the main body are integrally formed as a one-piece member, the second docking portion is on the bent portion, and the bent portion and the pushing portion are respectively on two opposite sides of the main body.

7. The holding module according to claim 2, wherein the positioning member has a fixed end and a free end, the fixed end is fixed on the fixation member, the free end is moveably arranged through a through hole of the fixation member, and the free end matches with the matching member selectively.

8. The holding module according to claim 3, wherein each of the first side plate and the second side plate is provided with the matching member, each of the two side arms of the fixation member is provided with the positioning member and the linkage portion, one of the positioning members is matched with the matching member of the first side plate, and the other one of the positioning members is matched with the matching member of the second side plate.

9. The holding module according to claim 8, wherein the holding member further comprises a plurality of the linkage members, each of the linkage members is pivotally connected to the carrier plate and comprises the docking portion and the pushing portion, and the docking portion of each of the linkage members is connected to the linkage portion of a corresponding one of the two side arms.

10. The holding module according to claim 1, wherein the carrier plate is provided with a pivot plate, the pivot plate extends from the carrier plate and is adjacent to either one of the first side plate and the second side plate, and the linkage member is pivotally connected to the pivot plate.

11. The holding module according to claim 2, wherein the linkage member is a connection base, the connection base has a bottom plate and a side plate, an angular relationship exists between the bottom plate and the side plate, the docking portion of the connection base is on the side plate, and the pushing portion is on the bottom plate.

12. The holding module according to claim 11, wherein a line connecting between the positioning member and a pivot portion of the fixation member is an axial line, and the linkage portion is on the side plate and is misaligned with the axial line.

13. The holding module according to claim 1, wherein the fixation member further comprises a positioning member, the holding member is provided with a matching member, and the positioning member matches with one of the matching member selectively so as to position the fixation member; the fixation member comprises a handle and two side arms respectively connected to two ends of the handle, the two side arms are provided with a plurality of the pivot portions, each of the two side arms is provided with a pivot portion, and each of the pivot portions is pivotally connected to the first side plate or the second side plate respectively; a line connecting between the positioning member of the fixation member and the pivot portion of the two side arm forms an axial line, and the linkage portion is between the positioning member and the pivot portion and aligned with the axial line; the linkage member comprises a first connection member and a second connection member, the first connection member is provided with a first shaft portion, a first docking portion, and a resisting portion, the first shaft portion is pivotally connected to a pivot plate of the carrier plate, the first docking portion and the resisting portion are respectively on two opposite ends of the first shaft portion, and the first docking portion is moveably connected to the linkage portion; the second connection member is provided with a second shaft portion, a second docking portion, and a pushing portion, the second shaft portion is pivotally connected to the carrier plate, the second docking portion and the pushing portion are respectively on opposite ends of the second shaft portion, the second docking portion is moveably connected to the resisting portion, and the pushing portion is connected to the expansion module selectively; the second connection member has a bent portion and a main body, the bent portion and the main body are integrally formed as a one-piece member, the second docking portion is on the bent portion, and the bent portion and the pushing portion are respectively on two opposite sides of the main body; the positioning member has a fixation end and a free end, the fixation end is fixed on the fixation member, the free end is moveably arranged through a through hole of the fixation member, and the free end matches with one of the matching member selectively; each of the first side plate and the second side plate is provided with the matching member, each of the two side arms of the fixation member is provided with the positioning member and the linkage portion, one of the positioning members is matched with one of the matching member of the first side plate, and the other one of the positioning members is matched with one of the matching member of the second side plate; the holding member further comprises a plurality of linkage members, each of the linkage members is pivotally connected to the carrier plate and comprises the docking portion and the pushing portion, and the docking portion of each of the linkage members is connected to the linkage portion of a corresponding one of the two side arms; the carrier plate is provided with the pivot plate, the pivot plate extends from the carrier plate and is adjacent to one of the first side plate and the second side plate, the linkage member is pivotally connected to the pivot plate.

14. An electronic device comprising:
a chassis;
a holding module mounted in the chassis, comprising:
  a holding member comprising a carrier plate, a first side plate, and a second side plate, wherein the first side plate and the second side plate are connected to two opposite sides of the carrier plate, respectively;
  a fixation member pivotally connected to the first side plate and the second side plate, wherein the fixation member is provided with a linkage portion; and
  a linkage member rotatably arranged in the holding member, wherein the linkage member comprises a docking portion and a pushing portion, wherein the docking portion is connected to the linkage portion; and
an expansion module arranged in the holding member and connected to the pushing portion.

15. The electronic device according to claim 14, wherein the expansion module is provided with a connector, and the expansion module is selectively driven by the fixation member and moved along an axial direction relative to the carrier plate, when the expansion module is moved along the axial direction, the connector is inserted into a connection hole of the holding member.

16. The electronic device according to claim 14, wherein the expansion module is provided with a plurality of slide slots, the carrier plate is provided with a plurality of convex engaging portions, and each of the convex engaging portions is aligned with each corresponding one of the slide slots.

17. The electronic device according to claim 14, wherein the fixation member further comprises a positioning member, the holding member is provided with a matching member, and the positioning member matches with the matching member selectively.

18. The electronic device according to claim 17, wherein the positioning member has a fixation end and a free end, the fixation end is fixed on the fixation member, the free end is moveably arranged through a through hole of the fixation member, and the free end is matches with the matching member selectively.

19. The electronic device according to claim 14, wherein the linkage member comprises a first connection member and a second connection member, the first connection member is provided with a first shaft portion, a first docking portion, and a resisting portion, the first shaft portion is pivotally connected to a pivot plate of the carrier plate, the first docking portion and the resisting portion are respectively on two opposite ends of the first shaft portion, and the first docking portion is moveably connected to the linkage portion; the second connection member is provided with a second shaft portion, a second docking portion, and a pushing portion, the second shaft portion is pivotally connected to the carrier plate, the second docking portion and the pushing portion are respectively on two opposite ends of the second shaft portion, the second docking portion is moveably connected to the resisting portion, and the pushing portion is connected to the expansion module selectively.

20. The electronic device according to claim 14, wherein the linkage member is a connection base, the connection base has a bottom plate and a side plate, an angular relationship exists between the bottom plate and the side plate, the docking portion of the connection base is on the side plate, and the pushing portion is on the bottom plate.

* * * * *